(12) United States Patent
Tsukahara et al.

(10) Patent No.: US 7,901,767 B2
(45) Date of Patent: Mar. 8, 2011

(54) METHOD FOR PRODUCING LAMINATE, BARRIER FILM SUBSTRATE, DEVICE AND OPTICAL MEMBER

(75) Inventors: Jiro Tsukahara, Kanagawa (JP); Yuya Agata, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 341 days.

(21) Appl. No.: 12/033,587

(22) Filed: Feb. 19, 2008

(65) Prior Publication Data
US 2008/0220198 A1 Sep. 11, 2008

(30) Foreign Application Priority Data

Feb. 20, 2007 (JP) ................................ 2007-039015
Oct. 29, 2007 (JP) ................................ 2007-280930
Dec. 26, 2007 (JP) ................................ 2007-334265

(51) Int. Cl.
*B32B 27/30* (2006.01)
*B32B 33/00* (2006.01)
(52) U.S. Cl. ........................................ 428/336; 428/522
(58) Field of Classification Search ........................ None
See application file for complete search history.

(56) References Cited

U.S. PATENT DOCUMENTS
4,200,681 A * 4/1980 Hall et al. ..................... 428/412
* cited by examiner

*Primary Examiner* — Ramsey Zacharia
(74) *Attorney, Agent, or Firm* — Birch, Stewart, Kolasch & Birch, LLP

(57) ABSTRACT

A method for producing a laminate having a structure of an organic layer and an inorganic layer laminated thereon, which comprises polymerizing a mixture that contains a monomer of the following formula (1) wherein m is 2 and a monomer of the following formula (1) wherein m is 3 or more, thereby forming the organic layer:

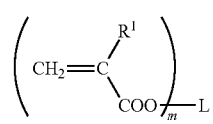

Formula (1)

wherein $R^1$ represents a hydrogen atom or a methyl group; and L represents an m-valent linking group.

15 Claims, No Drawings

METHOD FOR PRODUCING LAMINATE, BARRIER FILM SUBSTRATE, DEVICE AND OPTICAL MEMBER

BACKGROUND OF THE INVENTION

1. Field of the Invention

The present invention relates to an organic/inorganic laminate, more precisely, to an organic/inorganic laminate having a specific organic layer and therefore having a lowered water vapor permeability. Further, the invention relates to a barrier film substrate comprising the laminate, and to a device and an optical member comprising the barrier film substrate.

2. Description of the Related Art

Heretofore, a barrier film fabricated by forming a thin metal oxide film of aluminium oxide, magnesium oxide or silicon oxide on the surface of a plastic film is widely used for wrapping or packaging articles that require shielding from various gases such as water vapor or oxygen and for wrapping or packaging edibles, industrial articles and medicines for preventing them from being deteriorated.

Recently, in the field of liquid-crystal display devices and organic EL devices (organic electroluminescent devices), plastic film substrates are being used in place of glass substrates that are heavy and readily cracked or broken. As applicable to a roll-to-roll system, plastic film substrates are advantageous in point of cost. However, plastic film substrates are problematic in that their gas-barrier property is not good as compared with that of glass substrates. Therefore, when a plastic film substrate is used in a liquid-crystal display device, then water vapor may penetrate into the liquid-crystal cell, thereby causing display failures.

For solving the problem, it is known to form an organic/inorganic laminate on a plastic film, thereby using the resulting barrier film substrate. JP-A 2002-264274 discloses a barrier film substrate that comprises a laminate of an organic layer formed by curing a composition containing a 6-functional acrylate or methacrylate monomer or oligomer, and an inorganic layer of an oxide selected from an aluminium oxide, a silicon oxide, an indium/tin composite oxide and an indium/cerium composite oxide. JP-A 2002-264274 says that a higher content of the 6-functional acrylate monomer or the like within a range of at most 30% by mass increases the barrier capability of the film, in which, however, even though the content is 100% by mass, the water vapor permeability of the film could be on a level of 0.08 g/m²/day.

On the other hand, substrates for use in organic EL devices require a further higher water vapor barrier level. Preferably, their water vapor permeability is less than the detection limit in a MOCON method, or that is, less than 0.005 g/m²/day. To satisfy the requirement, U.S. Pat. No. 6,413,645 discloses a technique of providing an alternate laminate of plural organic layers and inorganic layers as a barrier layer, thereby realizing a water vapor permeability of less than 0.005 g/m²/day. The patent specification says that in case where only one organic layer and one inorganic layer are laminated, then the water vapor permeability of the resulting laminate is 0.011 g/m²/day, explicitly indicating the technical advantage that results from multilayer lamination.

However, in consideration of the industrial applicability, the multilayer lamination of organic layers and inorganic layers as in U.S. Pat. No. 6,413,645 lowers the producibility, and is therefore seriously problematic in industrial mass-production of barrier film substrates. For industrially mass-producing a large number of barrier film substrates at low cost, it is desired that a smaller number of layers in multilayer lamination could exhibit higher barrier capability. From the background, it is desired to develop an inorganic/organic laminate of one pair of an organic layer and an inorganic layer and capable of attaining a water vapor permeability of at most 0.005 g/m²/day, especially less than 0.001 g/m²/day, to develop a barrier film substrate comprising the laminate, and to develop an organic EL device comprising the barrier film substrate.

SUMMARY OF THE INVENTION

A first object of the invention is to provide an organic/inorganic laminate of one pair of an organic layer and an inorganic layer, having a sufficiently low water vapor permeability. A second object of the invention is to provide a barrier film substrate comprising the laminate, and to provide a device and an optical member of high durability.

The present inventors have assiduously studied and, as a result, have found that formation of an organic layer containing a specific material and further formation of an inorganic layer on it gives an excellent laminate and gives a barrier film substrate comprising the laminate, and have provided the present invention described below.

[1] A method for producing a laminate having a structure of an organic layer and an inorganic layer laminated thereon, which comprises polymerizing a mixture that contains a monomer of the following formula (1) wherein m is 2 and a monomer of the following formula (1) wherein m is 3 or more, thereby forming the organic layer:

Formula (1)

wherein R¹ represents a hydrogen atom or a methyl group; and L represents an m-valent linking group.

[2] The method for producing a laminate of [1], wherein the total blend ratio of the monomer of formula (1) wherein m is 2 and the monomer of formula (1) wherein m is 3 is at least 75% by mass.

[3] A method for producing a laminate having a structure of an organic layer and an inorganic layer laminated thereon, which comprises polymerizing a mixture that contains a monomer of the following formula (1) wherein m is 2 and a monomer of the following formula (1) wherein m is 3, thereby forming the organic layer:

Formula (1)

wherein R¹ represents a hydrogen atom or a methyl group; and L represents an m-valent linking group.

[4] The method for producing a laminate of [3], wherein the blend ratio of the monomer of formula (1) wherein m is 2 is from 60 to 80% by mass and the blend ratio of the monomer of formula (1) wherein m is 3 is from 20 to 40% by mass.

[5] A method for producing a laminate having a structure of an organic layer and an inorganic layer laminated thereon, which comprises polymerizing a mixture that contains a monomer of the following formula (1) wherein m is 2 and a monomer of the following formula (1) wherein m is 4 or more, thereby forming the organic layer:

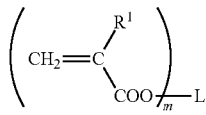
Formula (1)

wherein $R^1$ represents a hydrogen atom or a methyl group; and L represents an m-valent linking group.

[6] The method for producing a laminate of [5], wherein the blend ratio of the monomer of formula (1) wherein m is 2 is from 60 to 80% by mass and the blend ratio of the monomer of formula (1) wherein m is 4 or more is from 20 to 40% by mass.

[7] A method for producing a laminate having a structure of an organic layer and an inorganic layer laminated thereon, which comprises polymerizing a mixture that contains a monomer of the following formula (1) wherein m is 2, a monomer of the following formula (1) wherein m is 3, and a monomer of the following formula (1) wherein m is 4 or more, thereby forming the organic layer:

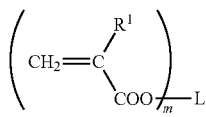
Formula (1)

wherein $R^1$ represents a hydrogen atom or a methyl group; and L represents an m-valent linking group.

[8] The method for producing a laminate of [7], wherein the total blend ratio of the monomer of formula (1) wherein m is 2 and the monomer of formula (1) wherein m is 3 is from 75 to 95% by mass, and the blend ratio of the monomer of formula (1) wherein m is 4 or more is from 5 to 25% by mass.

[9] The method for producing a laminate of any one of [1] to [8], wherein L in formula (1) is a linking group not containing an oxygen-containing functional group.

[10] The method for producing a laminate of any one of [1] to [9], wherein the organic layer is formed through flash vapor evaporation and the monomer mixture is polymerized in a vacuum of at most 100 Pa.

[11] The method for producing a laminate of any one of [1] to [10], wherein the barrier layer is formed by laminating the organic layer and an inorganic layer all the time in a vacuum of at most 100 Pa.

[12] The method for producing a laminate of any one of [1] to [1,1], which comprises polymerizing the monomer mixture disposed on a support through UV polymerization at an energy radiation level of at least 2 J/cm$^2$ in a vacuum of at most 100 Pa.

[13] The method for producing a laminate of any one of [1] to [12], wherein the organic layer is formed in a clean room.

[14] A barrier laminate consisting of the laminate produced by the method of any one of [1] to [13].

[15] A barrier laminate having a structure of an organic layer and an inorganic layer laminated thereon, wherein the water vapor permeability per one inorganic layer that constitutes the barrier laminate, at 40° C. and a relative humidity of 90%, is at most $1 \times 10^{-3}$ g/m$^2$·day.

[16] The barrier laminate according to [14] or [15], wherein the number of defects with a length of at least 1 μm on a surface of the barrier laminate is at most 30.

[17] The barrier laminate according to any one of [14] to [16], wherein the organic layer has a pencil hardness of at least 2H.

[18] The barrier laminate according to any one of [14] to [17], wherein the organic layer has a microhardness of at least 150 N/mm.

[19] The barrier laminate according to any one of [14] to [18], wherein the smoothness of the inorganic layer is on a level of at most 1 nm in terms of the mean roughness in 10 μm square.

[20] The barrier laminate according to any one of [14] to [19], wherein the thickness of the inorganic layer is from 20 to 60 nm.

[21] A barrier film substrate having the barrier laminate of any one of [14] to [20] on a surface of a plastic film.

[22] A barrier film substrate having, on at least one surface of a plastic film, a barrier layer that has a structure of an organic layer and an inorganic layer laminated thereon, wherein the organic layer comprises, as the main ingredient thereof, a polymer having a structural unit of the following formula (2) wherein n is 2 and a structural unit of the following formula (2) wherein n is 3 or more:

Formula (2)

wherein Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

[23] The barrier film substrate of [22], wherein the polymer contains the structural unit of formula (2) wherein n is 2 and the structural unit of formula (2) wherein n is 3 in an amount of at least 75% by mass in total.

[24] A barrier film substrate having, on at least one surface of a plastic film, a barrier layer that has a structure of an organic layer and an inorganic layer laminated thereon, wherein the organic layer comprises, as the main ingredient thereof, a polymer having a structural unit of the following formula (2) wherein n is 2 and a structural unit of the following formula (2) wherein n is 3:

Formula (2)

wherein Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

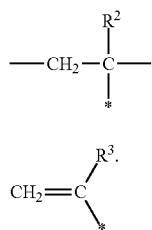

[25] The barrier film substrate of [24], wherein the polymer contains the structural unit of formula (2) wherein n is 2 in an amount of from 60 to 80% by mass, and the structural unit of formula (2) wherein n is 3 in an amount of from 20 to 40% by mass.

[26] A barrier film substrate having, on at least one surface of a plastic film, a barrier layer that has a structure of an organic layer and an inorganic layer laminated thereon, wherein the organic layer comprises, as the main ingredient thereof, a polymer having a structural unit of the following formula (2) wherein n is 2 and a structural unit of the following formula (2) wherein n is 4 or more:

(Z—COO)$_n$-L                              Formula (2)

wherein Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

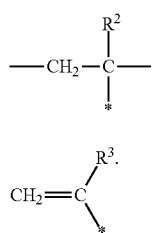

[27] The barrier film substrate of [26], wherein the polymer contains the structural unit of formula (2) wherein n is 2 in an amount of from 60 to 80% by mass, and the structural unit of formula (2) wherein n is 4 or more in an amount of from 20 to 40% by mass.

[28] A barrier film substrate having, on at least one surface of a plastic film, a barrier layer that has a structure of an organic layer and an inorganic layer laminated thereon, wherein the organic layer comprises, as the main ingredient thereof, a polymer having a structural unit of the following formula (2) wherein n is 2, a structural unit of the following formula (2) wherein n is 3 and a structural unit of the following formula (2) wherein n is 4 or more:

(Z—COO)$_n$-L                              Formula (2)

wherein Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

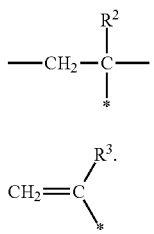

[29] The barrier film substrate of [28], wherein the polymer contains the structural unit of formula (2) wherein n is 2 and/or the structural unit of formula (2) wherein n is 3 in an amount of from 75 to 95% by mass in total, and the structural unit of formula (2) wherein n is 4 or more in an amount of from 5 to 25% by mass.

[30] The barrier film substrate of any one of [22] to [29], wherein L in formula (2) is a linking group not containing an oxygen-containing functional group.

[31] A device comprising a laminate produced according to the method of any one of [1] to [13].

[32] A device comprising, as a sealing film, a laminate produced according to the method of any one of [1] to [13].

[33] The device of [31] or [32], wherein the device is an organic EL device.

[34] An optical member comprising, as a sealing film, a laminate produced according to the method of any one of [1] to [13].

[35] A method for producing a device, which comprises forming a laminate on a substrate according to the method of any one of [1] to [13].

The invention has made it possible to provide a laminate having a low water vapor permeability even though it comprises only one pair of an organic layer and an inorganic layer. The production method of the invention facilitates the production of a barrier film substrate having the laminate. Further, the device and the optical member of the invention have high durability.

BEST MODE FOR CARRYING OUT THE INVENTION

The laminate and its production method, the barrier film substrate, the device and the optical member of the invention are described in detail hereinunder. The description made hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof. In the structural formulae in this description, O indicates an oxygen atom.

<Laminate and Production Method for It>

The laminate of the invention comprises at least one organic region or organic layer and at least one inorganic region or inorganic layer. For simplifying the description hereinunder, the organic layer and the organic region are referred to as "organic layer"; and the inorganic layer and the inorganic region are referred to as "inorganic layer". In case where the laminate comprises plural organic layers and inorganic layers, in general, it is desirable that the organic layers and the inorganic layers are alternately laminated to constitute the laminate.

In case where the laminate comprises a constitution of an organic region and an inorganic region, the regions may form a gradation material layer where the regions continuously change in the thickness direction of the layer. As examples of the gradation material, there are mentioned materials described in Kim et al's report, Journal of Vacuum Science and Technology A Vol. 23 pp. 971-977 (2005 American Vacuum Society); and gradation layers of an organic layer and an inorganic layer laminated with no boundary therebetween as in US Laid-Open 2004-46497.

The laminate of the invention may have any other functional layer than the organic layer and the inorganic layer. As examples of the functional layer, preferred are those to be mentioned hereinunder in the section of plastic films.

The present invention is characterized in that the organic layer contains a polymer having a structural unit of formula (2). The laminate of the invention may have any other functional layer.

(Organic Layer)

The organic layer comprises, as the main ingredient thereof, a polymer (a) having a structural unit of formula (2) wherein n is 2 and a structural unit of formula (2) wherein n is 3 or more. In particular, preferred is a layer comprising, as the main ingredient thereof, a polymer (b) having a structural unit where n is 2 and a structural unit where n is 3, a polymer (c) having a structural unit where n is 2 and a structural unit where n is 4 or more, or a polymer (d) having a structural unit where n is 2, a structural unit where n is 3 and a structural unit where n is 4 or more.

(Z—COO)$_n$-L  Formula (2)

In formula (2), Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

Preferably, the above-mentioned polymers (a) to (d) contains the structural units where n is 2 and/or 3 in an amount of at least 75% by mass.

The number of the carbon atoms that constitute L is preferably from 3 to 18, more preferably from 4 to 17, even more preferably from 5 to 16, still more preferably from 6 to 15.

When n is 2, then L represents a divalent linking group. Examples of the divalent linking group include an alkylene group (e.g., 1,3-propylene group, 2,2-dimethyl-1,3-propylene group, 2-butyl-2-ethyl-1,3-propylene group, 1,6-hexylene group, 1,9-nonylene group, 1,12-dodecylene group, 1,16-hexadecylene group), an ether group, an imino group, a carbonyl group, and divalent residues of two or more such divalent groups bonding to each other in series (e.g., polyethyleneoxy group, polypropyleneoxy group, propionyloxyethylene group, butyroyloxypropylene group, caproyloxyethylene group, caproyloxybutylene group).

Of those, preferred is an alkylene group.

L may have a substituent. Examples of the substituent that L may have include an alkyl group (e.g., methyl group, ethyl group, butyl group), an aryl group (e.g., phenyl group), an amino group (e.g., amino group, methylamino group, dimethylamino group, diethylamino group), an alkoxy group (e.g., methoxy group, ethoxy group, butoxy group, 2-ethylhexyloxy group), an acyl group (e.g., acetyl group, benzoyl group, formyl group, pivaloyl group), an alkoxycarbonyl group (e.g., methoxycarbonyl group, ethoxycarbonyl group), a hydroxyl group, a halogen atom (e.g., fluorine atom, chlorine atom, bromine atom, iodine atom), a cyano group. The substituent is preferably a group not having an oxygen-containing functional group for the reasons mentioned below, more preferably an alkyl group.

Specifically, when n is 2, then L is most preferably an alkylene group not having an oxygen-containing functional group. Having the substituent, the water vapor permeability of the layer may be more lowered.

When n is 3, then L represents a trivalent linking group. Examples of the trivalent linking group include a trivalent residue derived from the above-mentioned divalent linking group by removing one hydrogen atom; and a trivalent residue derived from the above-mentioned divalent linking group by removing one hydrogen atom, followed by substituting it with an alkylene group, an ether group, a carbonyl group or a divalent group of those groups bonding to each other in series. Of those, preferred is a trivalent residue derived from an alkylene group by removing one hydrogen atom, and not containing an oxygen-containing functional group. Having the substituent, the water vapor permeability of the layer may be more lowered.

When n is 4 or more, the L represents a tetravalent or more polyvalent linking group. The same as above may apply to examples of the tetravalent or more polyvalent linking group and also to preferred examples thereof. Especially preferred is a tetravalent residue derived from an alkylene group by removing two hydrogen atoms, and not containing an oxygen-containing functional group. Having the substituent, the water vapor permeability of the layer may be more lowered.

Polymer (a) Having Structural Unit where n is 2 and Structural Unit where n is 3 or More The polymer having a structural unit of formula (2) where n is 2 and a structural unit where n is 3 or more preferably contains the structural units where n is 2 and/or 3 in an amount of from 75 to 95% by mass, more preferably in an amount of from 75 to 90% by mass, more preferably from 75 to 85% by mass.

Polymer (b) Having Structural Unit where n is 2 and Structural Unit where n is 3

In the polymer having a structural unit of formula (2) where n is 2 and a structural unit where n is 3, the content of the structural unit where n is 2 is preferably from 60 to 80% by mass, more preferably from 65 to 75% by mass. In this, the content of the structural unit where n is 3 is preferably from 10 to 50% by mass, more preferably from 20 to 40% by mass. Within the range, the film hardness and the conversion in polymerization may be effectively and favorably satisfied.

Polymer (c) Having Structural Unit where n is 2 and Structural Unit where n is 4 or More In the polymer having a structural unit of formula (2) where n is 2 and a structural unit where n is 4 or more, the content of the structural unit where n is 4 or more is preferably from 10 to 50% by mass, more preferably from 20 to 40% by mass. In this, n is preferably 4.

Polymer (d) Having Structural Unit where n is 2, Structural Unit where n is 3 and Structural Unit where n is 4 or More In the polymer having a structural unit of formula (2) where n is 2, a structural unit where n is 3 and a structural unit where n is 4 or more, the total content of the structural unit where n is 2 and the structural unit where n is 3 is preferably from 75 to 95% by mass, more preferably from 75 to 90% by mass, even more preferably from 75 to 85% by mass. In this, the structural unit where n is 4 or more is preferably from 5 to 25% by mass, more preferably from 10 to 25% by mass, even more preferably from 15 to 25% by mass.

The polymers (a) to (d) may have a structural unit not represented by the formula (2). For example, it may have a structural unit formed in copolymerization with an acrylate monomer or a methacrylate monomer. In the polymer, the content of the structural unit not represented by the formula (2) is preferably at most 20% by mass, more preferably at most 15% by mass, even more preferably at most 10% by mass.

The organic layer comprises, as the main ingredient thereof, a polymer having a structural unit of formula (2). In this, the "main ingredient" is meant to indicate that the polymer having a structural unit of formula (2) accounts for at least 80% by mass of the overall weight of the organic layer. Preferably, the polymer content is at least 90% by mass. The polymer not having a structural unit of formula (2) and capable of being incorporated in the organic layer includes, for example, polyester, methacrylic acid/maleic acid copolymer, polystyrene, transparent fluororesin, polyimide, fluoropolyimide, polyamide, polyamidimide, polyetherimide, cellulose acylate, polyurethane, polyether ketone, polycarbonate, alicyclic polyolefin, polyarylate, polyether sulfone, polysulfone, fluorene ring-modified polycarbonate, alicyclic-modified polycarbonate, fluorene ring-modified polyester.

The polymer that constitutes the organic layer of the barrier film substrate of the invention may be produced by polymerizing a monomer mixture comprising a monomer of the following formula (1) where m is 2 and a monomer where m is 3 or more, especially by polymerizing a monomer mixture comprising a monomer where m is 2 and a monomer where m is 3, or by polymerizing a monomer mixture comprising a monomer where m is 2 and a monomer where m is 4 or more, or by polymerizing a monomer mixture comprising a monomer where m is 2, a monomer where m is 3 and a monomer where m is 4 or more.

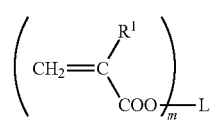

Formula (1)

In formula (1), $R^1$ represents a hydrogen atom or a methyl group; and L represents an m-valent linking group.

In case where m is 2 or more, $R^1$'s may be the same or different. Examples and preferred ranges of L may be the same as those in formula (2) mentioned above. The content and its preferred range of the monomer where m is 2 and the monomer where m is 3 or more (the monomer where m is 3, the monomer where m is 4 or more) in the monomer mixture may be the same as the content and its preferred range of the structural unit of formula (2) where n is 2 and the structural unit where n is 3 or more (the structural unit where n is 3, the structural unit where n is 4 or more).

Examples of the monomer of formula (1) where m is 2 or 3 are shown below, to which, however, the monomer where m is 2 or 3 employable in the invention should not be limited.

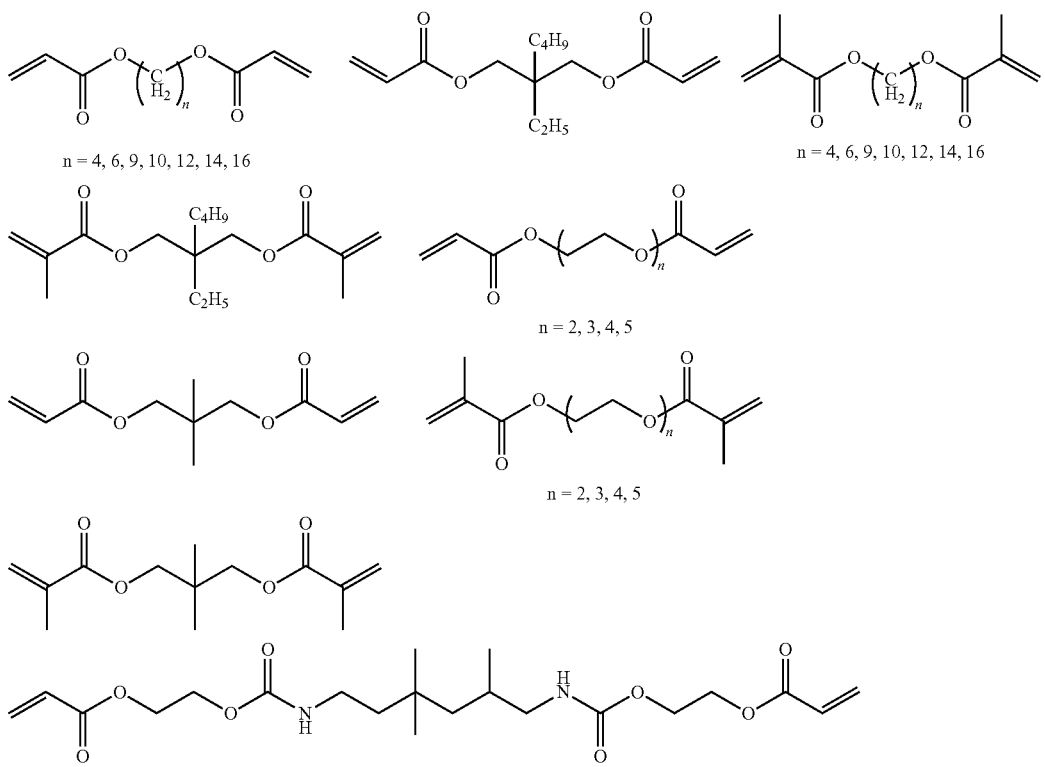

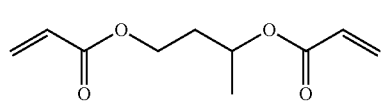
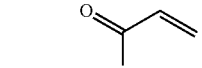
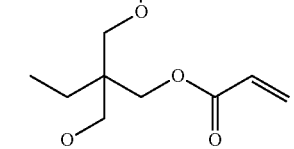
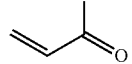
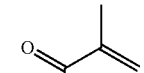
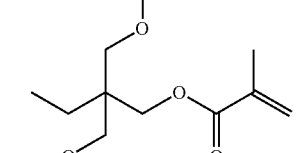
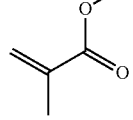
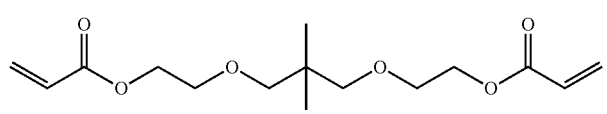
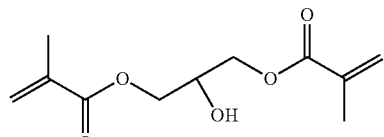
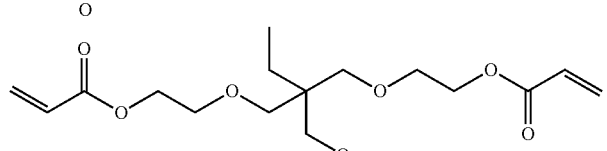
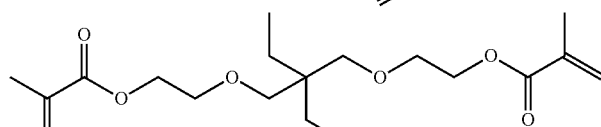
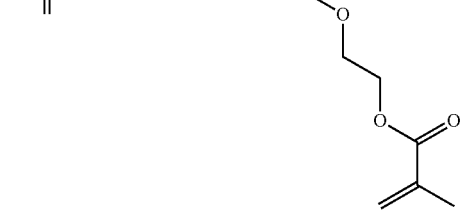
-continued
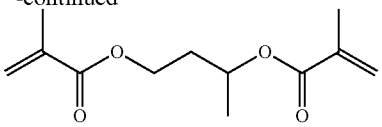
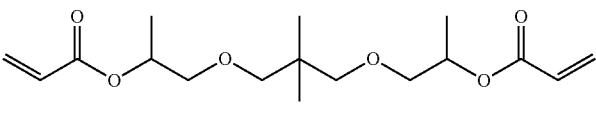
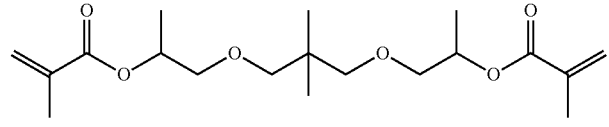
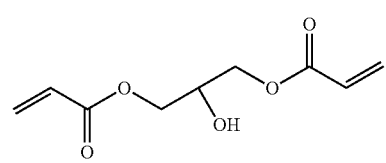

As the monomer of formula (1) where m is 4 or more, herein employable are those where m is from 4 to 6, and preferred are those where m is 4. Concretely, there are mentioned monomers having a pentaerythritol skeleton or a dipentaerythritol skeleton.

Examples of the monomer of formula (1) where m is 4 or more are shown below, to which, however, the monomer where m is 4 or more employable in the invention should not be limited.

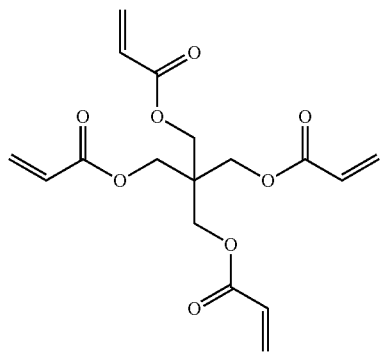

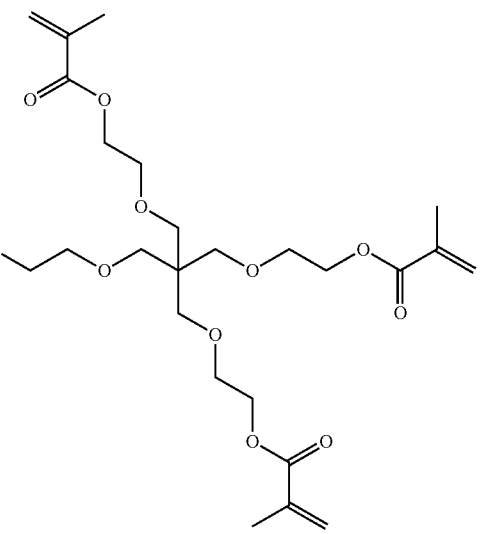

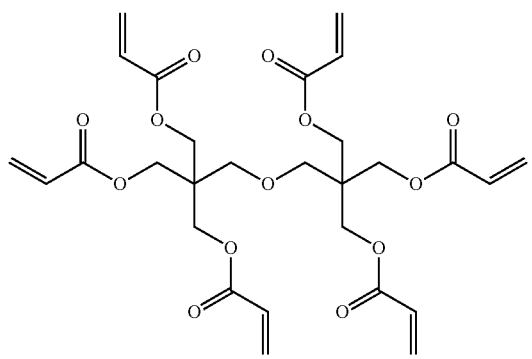

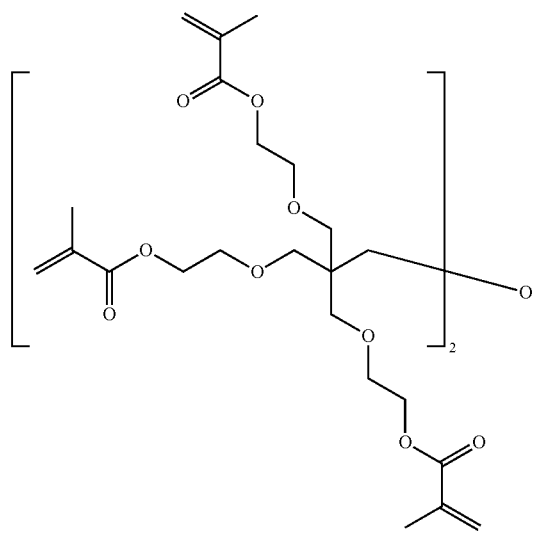

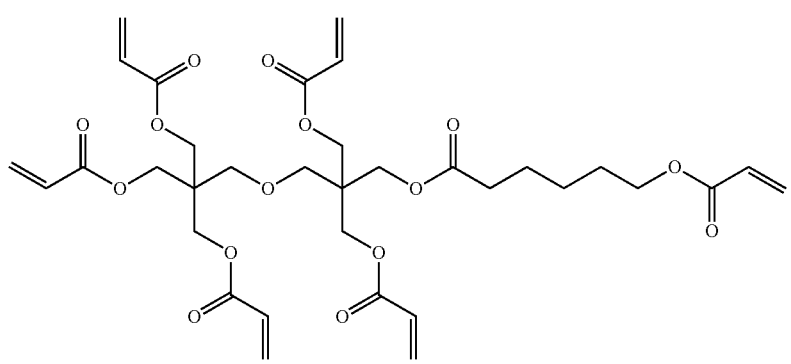

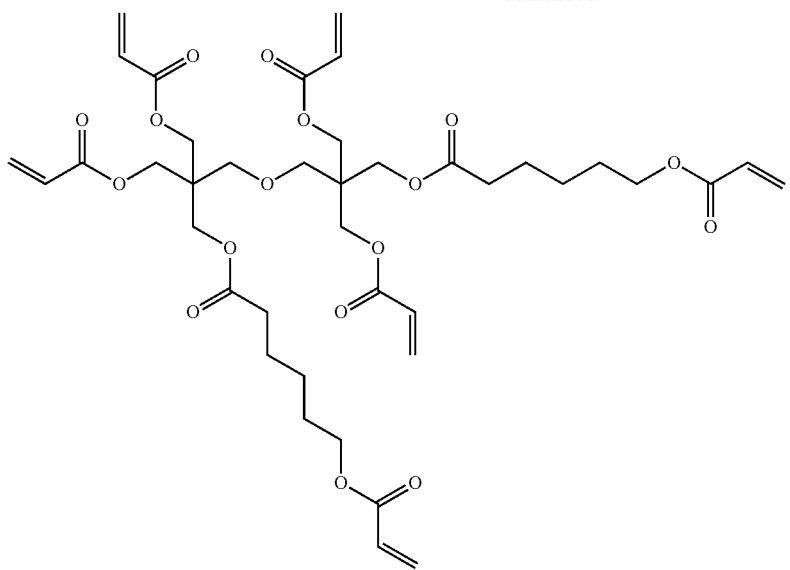
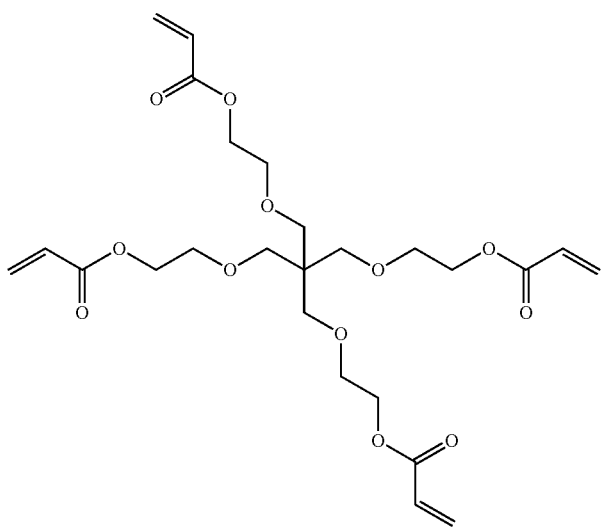
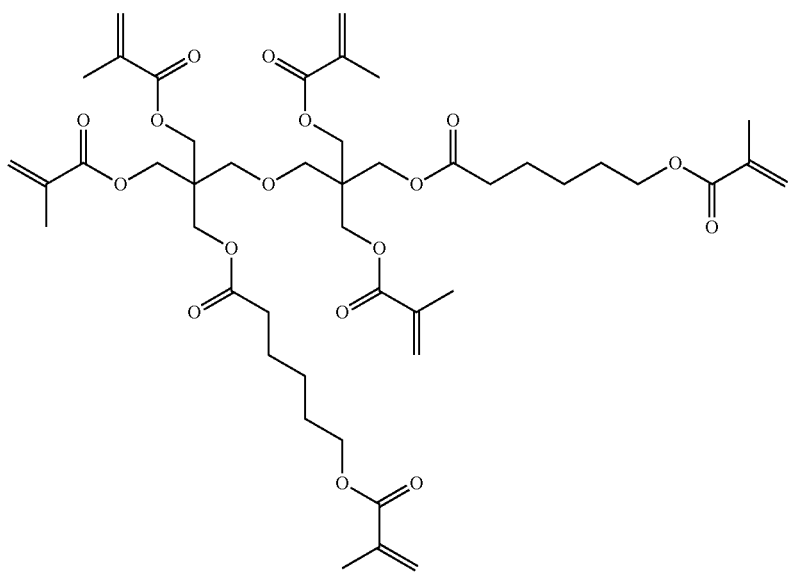

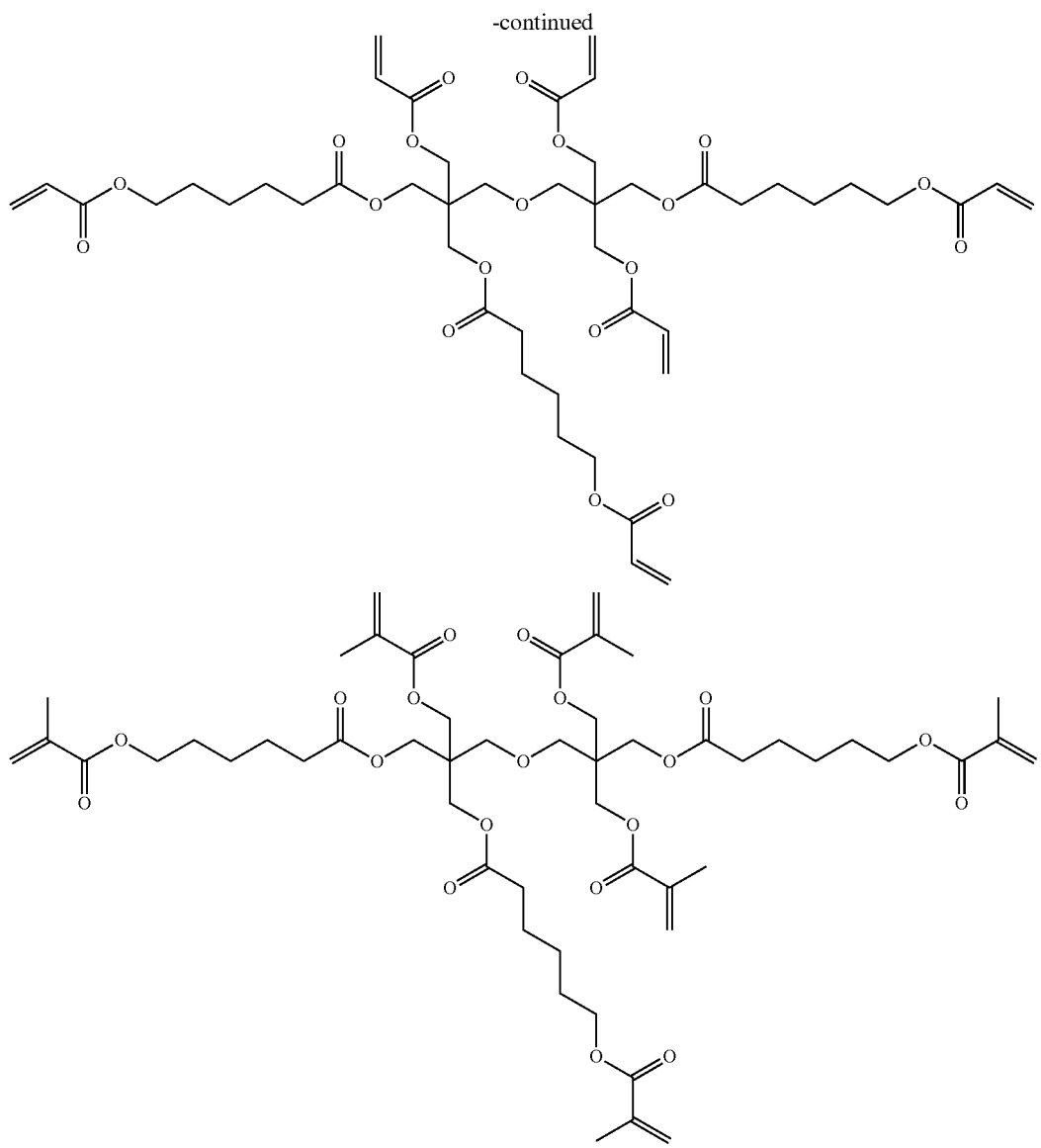

The monomer mixture may contain only one type of the monomer of formula (1) where m is 2 and only one type of the monomer where m is 3 (only one type of the monomer where m is 3 and only one type of the monomer where m is 4 or more), but may contain two or more different types of such monomers.

The inventors' studies have confirmed that the high hardness of the organic layer formed through polymerization is important for enhancing the barrier property of the layer. For increasing the hardness of the organic layer, employable are the following methods.
(1) The conversion of monomer in polymerization is increased.
(2) A polyfunctional monomer is used.
(3) A flexible, oxygen-containing functional group is not used as the linking group in monomer.

The conversion in polymerization and the number of functional group are in a relation of trade-off, or that is, the increase in the number of functional group brings about the reduction in the conversion in polymerization. The present inventors have investigated a method of increasing the number of functional group in a monomer and increasing the conversion in polymerization, and, as a result, have reached a result that the above-mentioned monomer blend ratio is favorable. The conversion in polymerization is preferably at least 90%.

The film hardness of the organic layer may be expressed by a pencil hardness thereof. In the invention, preferably the organic layer has a pencil hardness of at least H, and more preferably the organic layer has a pencil hardness of at least 2H. The hardness of the organic layer ma also be expressed by a microhardness thereof based on a nanoindentation method. Preferably, the microhardness of the organic layer is at least 150 N/mm, more preferably at least 180 N/mm, even more preferably at least 200 N/mm.

The reason why the high hardness of the organic layer could enhance the barrier property thereof is not clear. For this, the present inventors presume that an inorganic layer may be laminated more smoothly on a smooth organic layer having a higher hardness. Specifically, in formation of an inorganic layer according to a sputtering method or a PECVD method, the flying inorganic clusters have kinetic energy, and when they adhere to the surface of an organic layer, they give mechanical shock to the organic layer; and therefore, an organic layer having a higher hardness could be resistant to the shock and a smooth inorganic film may be formed on it. Examples given hereinunder clarify the data to support the reason for the presumption.

Specifically, when an organic layer having a pencil hardness of not lower than H is formed, then the laminate may attain a lower degree of water vapor permeability. Formation of an organic layer having preferred smoothness and hardness may be attained by specifically defining the blend ratio of the monomers of formula (1) that constitute the monomer mixture to give the layer.

In case where the monomer mixture comprises, as the monomer components therein, only a monomer of formula (1) where m is 2 and a monomer where m is 3, then the blend ratio of the monomer where m is 2 is preferably from 60 to 80% by mass, more preferably from 65 to 75% by mass. In this, the blend ratio of the monomer where m is 3 is preferably from 20 to 40% by mass, more preferably from 25 to 35% by mass.

In case where the monomer mixture comprises, as the monomer components therein, only a monomer of formula (1) where m is 2 and a monomer where m is 4 or more, then the blend ratio of the monomer where m is 2 is preferably from 75 to 95% by mass, more preferably from 75 to 90% by mass, even more preferably from 75 to 85% by mass. In this, the blend ratio of the monomer where m is 4 or more is preferably from 5 to 25% by mass, more preferably from 10 to 25% by mass, even more preferably from 15 to 25% by mass.

In case where the monomer mixture comprises, as the monomer components therein, only a monomer of formula (1) where m is 2, a monomer where m is 3 and a monomer where m is 4 or more, then the blend ratio of the monomer where m is 2 or 3 is preferably from 75 to 95% by mass, more preferably from 75 to 90% by mass, even more preferably from 75 to 85% by mass. In this, the blend ratio of the monomer where m is 4 or more is preferably from 5 to 25% by mass, more preferably from 10 to 25% by mass, even more preferably from 15 to 25% by mass.

The monomer mixture for use in the invention may contain a monomer not represented by the formula (1). The monomer may be a bar to increasing the hardness of the organic layer, which is a characteristic of the invention, and therefore, it is desirable that the additional monomer content is at most 20% by mass of the monomer mixture. The monomer not represented by formula (1) may be, for example, a monofunctional monomer, preferably a monofunctional acrylate monomer or a monofunctional methacrylate monomer. The molecular weight of the monofunctional acrylate monomer and the monofunctional methacrylate monomer is not specifically defined. In general, it may be from 150 to 600. One or more different types of such monomers may be in the monomer mixture. The monofunctional monomer has an effect of increasing the conversion in polymerization, but if its amount is too large, then it may detract from the hardness of the organic layer formed. Therefore, as so mentioned in the above, the monofunctional monomer content is preferably at most 20% by mass. More preferably, the range of the content is the same as that of the structural unit not represented by the formula (2)

Preferred examples of the monofunctional monomer are shown below, to which, however, the monofunctional monomer usable in the invention should not be limited.

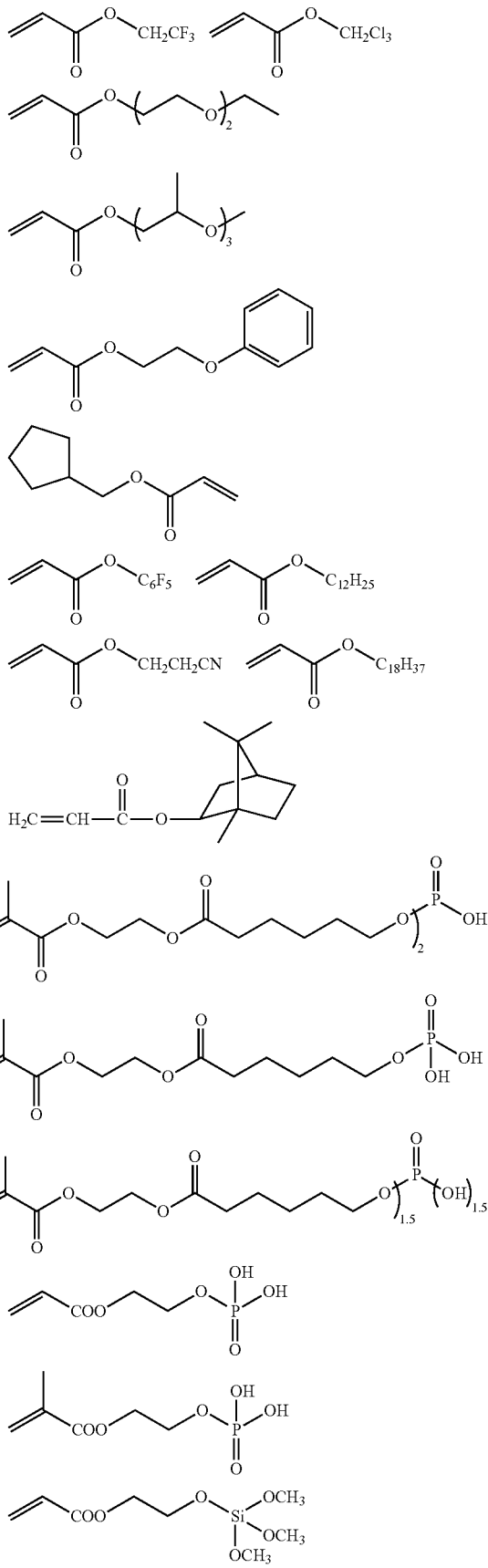

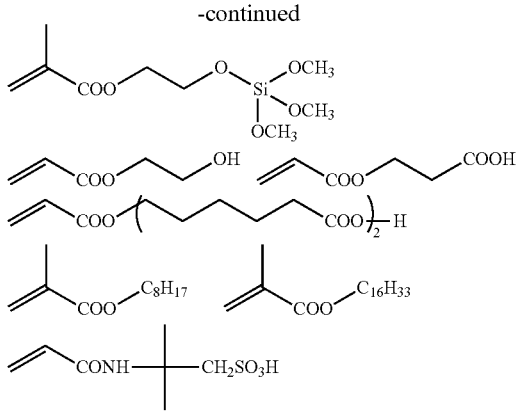

The monomer mixture for use in the invention may contain a phosphate-type (meth)acrylate monomer and a silane coupling group-having (meth)acrylate monomer for adhesiveness improvement. Depending on the number of the functional group therein, the amount of the monomer to be added may be so defined as to fall within the range of the amount thereof mentioned above.

Preferred examples of the phosphate-type (meth)acrylate monomer and the silane coupling group-having (meth)acrylate monomer are shown below, to which, however, the monomers usable in the invention should not be limited.

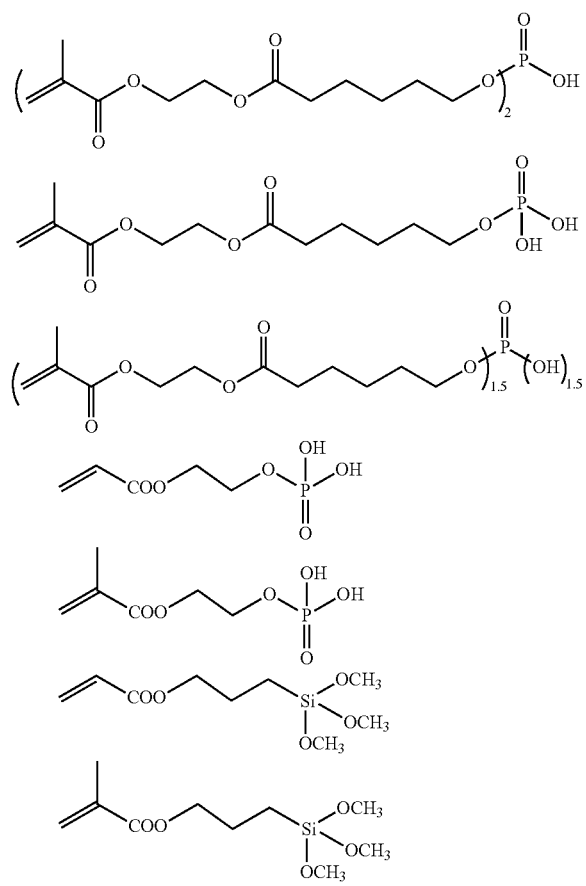

For forming the organic layer, employable are ordinary solution coating method and vacuum film formation method. The solution coating method includes, for example, a dip coating method, an air knife coating method, a curtain coating method, a roller coating method, a wire bar coating method, a gravure coating method, a slide coating method, and an extrusion coating method of using a hopper as in U.S. Pat. No. 2,681,294. Not specifically defined, the vacuum film formation method is preferably a flash vacuum evaporation method as in U.S. Pat. Nos. 4,842,893, 4,954,371, 5,032,461. The flash vacuum evaporation method is especially useful as having an effect of lowering the dissolved oxygen in monomer and as capable of increasing the conversion in polymerization.

The monomer polymerization method is not specifically defined, for which, for example, preferred is thermal polymerization, light (UV, visible ray) polymerization, electronic beam polymerization, plasma polymerization or their combination. Of those, especially preferred is photopolymerization. In photopolymerization, a photopolymerization initiator may be used. Examples of the photopolymerization initiator are Irgacure series (e.g., Irgacure 651, Irgacure 754, Irgacure 184, Irgacure 2959, Irgacure 907, Irgacure 369, Irgacure 379, Irgacure 819) sold by Ciba Specialty Chemicals; Darocure series (e.g., Darocure TPO, Darocure 1173); Quantacure PDO; Esacure series (e.g., Esacure TZM, Esacure TZT) and oligomer-type Esacure KIP series sold by Sartomer.

The light for irradiation is generally UV light from high-pressure mercy lamp or low-pressure mercy lamp. The irradiation energy is preferably at least 0.5 J/cm$^2$, more preferably at least 2 J/cm$^2$. Since acrylate and methacrylate receive polymerization inhibition by oxygen in air, it is desirable that the oxygen concentration or the oxygen partial pressure during the monomer polymerization is reduced. For this, employable are an inert gas substitution method (nitrogen substitution method, argon substitution method), and a pressure reduction method. Of those, the reduced-pressure curing method is more preferred as having an effect of lowering the dissolved oxygen concentration in monomer.

In case where the oxygen concentration in polymerization is lowered by a nitrogen substitution method, the oxygen concentration is preferably at most 2%, more preferably at most 0.5%. In case where the oxygen partial pressure in polymerization is lowered by a pressure reduction method, the total pressure is preferably at most 1000 Pa, more preferably at most 100 Pa. Especially preferred is UV polymerization with energy irradiation of at least 2 J/cm$^2$ under a reduced pressure condition of at most 100 Pa. Most preferably, a monomer film formed by a flash vapor evaporation method is subjected to UV polymerization with energy irradiation at 2 J/cm$^2$ or more under a reduced pressure. Taking the method may increase the conversion in polymerization, therefore giving an organic film having a high hardness. Polymerization under reduced pressure increases the conversion in polymerization, and this is clarified by Examples given hereinunder. Preferably, the monomer is polymerized after the monomer mixture is disposed in an intended site by coating or vapor deposition.

Preferably, the monomer conversion in polymerization is at least 85%, more preferably at least 88%, even more preferably at least 90%, still more preferably at least 92%. The conversion in polymerization as referred to herein means the ratio of the reacted polymerizing group of all the polymerizing group (acryloyl group and methacryloyl group) in the monomer mixture. The conversion in polymerization may be determined by an IR absorption method. The details of the method are described in Examples.

The thickness of the organic layer is not specifically defined. However, when too thin, the layer could not be uniform; but when too thick, the layer may be cracked and its barrier capability may lower. From these viewpoints, the thickness of the organic layer is preferably from 50 nm to 2000 nm, more preferably from 200 nm to 1500 nm.

Preferably, the organic layer is smooth, as so mentioned hereinabove. Preferably, the smoothness of the organic layer is on a level of at most 2 nm, more preferably at most 1 nm in terms of the mean roughness (Ra value) in 10 μm square. The organic layer is required to have neither impurities such as particles nor projections. Accordingly, it is desirable that the organic layer is formed in a clean room. Preferably, the degree of cleanness is at most class 10000, more preferably at most class 1000.

Two or more organic layers may be laminated. In this case, the layers may have the same composition or different compositions. In case where two or more layers are laminated, the individual organic layers are preferably so designed that they fall within the above-mentioned preferred ranges. In addition, as so mentioned hereinabove and as disclosed in UP Laid-Open 2004-46497, the organic layers may be gradation layers of which the composition changes continuously in the thickness direction of the layer, with no definite boundary to the adjacent inorganic layer.

(Inorganic Layer)

The inorganic layer is, in general, a layer of a thin film formed of a metal compound. For forming the inorganic layer, employable is any method capable of producing the intended thin film. For it, for example, suitable are physical vapor deposition methods (PVD) such as vapor evaporation method, sputtering method, ion plating method; various chemical vapor deposition methods (CVD); liquid phase growth methods such as plating or sol-gel method. Of those, preferred are physical vapor deposition methods (PVD) and chemical vapor deposition methods (CVD), which may evade thermal influences on the substrate film in inorganic layer formation, and which may readily produce uniform thin film layers at rapid production speed. Not specifically defined, the component to be in the inorganic layer may be any one satisfies the above-mentioned requirements. For example, it includes oxides, nitrides or oxinitrides containing at least one metal selected from Si, Al, In, Sn, Zn, Ti, Cu, Ce and Ta. Of those, preferred are oxides, nitrides or oxinitrides of a metal selected from Si, Al, In, Sn, Zn and Ti; more preferred are metal oxides, nitrides or oxinitrides with Si or Al. These may contain any other element as a subsidiary component.

In the invention, an inorganic layer is formed on the above-mentioned smooth and hard organic layer, and therefore, an inorganic layer of high smoothness may be formed. Accordingly, even though the inorganic layer is thin, it may have good barrier property; and even though only one inorganic layer is formed on the organic layer, the resulting laminate may have good barrier property. The effect results from the organic layer satisfying both good surface smoothness and high hardness. For example, when an inorganic film formation method of sputtering is employed, the inorganic matter that deposits on the organic layer as an overlying layer thereon, it has kinetic energy. Accordingly, in case where an inorganic layer is formed on a smooth but soft organic layer, then the surface of the organic layer may be roughened owing to the shock of the inorganic matter that deposits on the layer, and therefore, the smoothness of the formed inorganic layer may worsen. In the invention, the hardness of the organic layer is increased while the layer keeps its surface smoothness, and therefore the layer may be resistant to the shock and the formed inorganic layer may be smooth, and it may realize good barrier property even though it is thin.

Preferably, the surface smoothness of the inorganic layer formed in the invention is less than 2 nm in terms of the mean roughness (Ra value) in 10 μm square, more preferably at most 1 nm. Accordingly, it is desirable that the inorganic layer is formed in a clean room. Preferably, the degree of cleanness is at most class 10000, more preferably at most class 1000.

Not specifically defined, the thickness of the inorganic layer is generally within a range of from 5 to 500 nm/layer. The laminate and the barrier film substrate of the invention exhibit good barrier property even though the inorganic layer therein is thin, and therefore, the inorganic layer is preferably as thin as possible for increasing the producibility and for reducing the cost. The thickness of the inorganic layer is preferably from 20 to 200 nm, more preferably from 30 to 90 nm.

In the invention, the laminate may have good barrier property even though it comprises only a pair of an organic layer and an inorganic layer, and therefore the number of the organic layer is preferably one, from the viewpoint of the production efficiency and the cost. Needless-to-say, two or more inorganic layers may be laminated. In such a case, the individual layers may have the same composition or different compositions. In case where two or more layers are laminated, it is desirable that the individual inorganic layers are so designed as to fall within the above-mentioned preferred ranges. In addition, as so mentioned hereinabove and as disclosed in UP Laid-Open 2004-46497, the inorganic layers may be gradation layers of which the composition changes continuously in the thickness direction of the layer, with no definite boundary to the adjacent inorganic layer.

(Lamination of Organic Layer and Inorganic Layer)

The organic layer and the inorganic layer may be laminated by repeated film formation to form the organic layer and the inorganic layer in a desired layer constitution. In case where the inorganic layer is formed according to a vacuum film formation method such as sputtering method, vacuum evaporation method, ion plating method or plasma CVD method, then it is desirable that the organic layer is also formed according to a vacuum film formation method such as the above-mentioned flash vapor deposition method. While the barrier layer is formed, it is especially desirable that the organic layer and the inorganic layer are laminated all the time in a vacuum of at most 1000 Pa, not restoring the pressure to an atmospheric pressure during the film formation. More preferably, the pressure is at most 100 Pa, even more preferably at most 50 Pa, still more preferably at most 20 Pa.

(Functional Layer)

The device of the invention may have a functional layer on the barrier laminate or in any other position. The functional layer is described in detail in JP-A 2006-289627, paragraphs 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an adhesive layer, etc.

(Use of Barrier Laminate)

In general, the barrier laminate of the invention is formed on a support. Selecting the support, the barrier laminate may have various applications. The support includes a substrate film, as well as various devices, optical members, etc. Concretely, the barrier laminate of the invention may be used as a barrier layer of a barrier film substrate. The barrier laminate and the barrier film substrate of the invention may be used for sealing up devices that require gas-barrier performance. The barrier laminate and the barrier film substrate of the invention may apply optical members. These are described in detail hereinunder.

<Barrier Film Substrate>

The barrier film substrate comprises a substrate film and a barrier laminate formed on the substrate film. In the barrier film substrate, the barrier laminate of the invention may be provided only one surface of the substrate film, or may be provided on both surfaces thereof. The barrier laminate of the invention may be laminated in an order of an inorganic layer and an organic layer from the side of the substrate film; or may be laminated in an order of an organic layer and an inorganic layer from it. The uppermost layer of the laminate of the invention may be an inorganic layer or an organic layer.

The barrier film substrate of the invention is a film substrate having a barrier layer that functions to block oxygen, water, nitrogen oxide, sulfur oxide, ozone and others in air.

Not specifically defined, the number of the layers that constitute the barrier film substrate may be typically from 2 layers to 30 layers, more preferably from 3 layers to 20 layers.

The barrier film substrate may have any other constitutive components (e.g., functional layers such as adhesive layer) in addition to the barrier laminate and the substrate film. The functional layer may be disposed on the barrier laminate, or between the barrier laminate and the substrate film, or on the side (back) of the substrate film not coated with the barrier laminate.

(Plastic Film)

In the barrier film substrate of the invention, the substrate film is generally a plastic film. Not specifically defined in point of the material and the thickness thereof, the plastic film usable herein may be any one capable of supporting a laminate of an organic layer and an inorganic layer; and it may be suitably selected depending on the use and the object thereof. Concretely, the plastic film includes metal supports (e.g., aluminium, copper, stainless), and thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the barrier film substrate of the invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of at least 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

Since the barrier film substrate of the invention is usable in devices such as organic EL devices, the plastic film is transparent, or that is, its light transmittance is generally at least 80%, preferably at least 85%, more preferably at least 90%. The light transmittance may be measured according to the method described in JIS-K7105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the barrier film substrate of the invention is used in displays, it does not always require transparency in a case where it is not disposed on the viewers' side. Accordingly in such a case, a nontransparent material may be used for the plastic film. The nontransparent material includes, for example, polyimide, polyacrylonitrile, known liquid-crystal polymer.

Not specifically defined, the thickness of the plastic film for use in the barrier film substrate of the invention may be suitably selected depending on its use. Typically, the thickness may be from 1 to 800 μm, preferably from 10 to 200 μm. The plastic film may have a functional layer such as a transparent conductive layer, a primer layer, etc. The functional layer is described in detail in JP-A 2006-289627, paragraphs 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an adhesive layer, etc.

<Device>

The barrier laminate and the barrier film substrate of the invention are favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, other electronic devices. More preferred are organic EL devices.

The barrier laminate of the invention may be used for film-sealing of devices. Specifically, this is a method of providing a barrier laminate of the invention on the surface of a device serving as a support by itself. Before providing the barrier laminate, the device may be covered with a protective layer.

The barrier film substrate of the invention may be used as a substrate of a device or as a film for sealing up according to a solid sealing method. The solid sealing method comprises forming a protective layer on a device, then forming an adhesive layer and a barrier film substrate as laminated thereon, and curing it. Not specifically defined, the adhesive may be a thermosetting epoxy resin, a photocurable acrylate resin, etc.

(Organic EL Device)

Examples of an organic EL device with a barrier film substrate are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the barrier film substrate of the invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the substrate of the invention may be sued as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensatory bent) type, a CPA (continuous pinwheel alignment) type, or an IPS (in-plane switching) type.

(Others)

Other applications of the invention are thin-film transistors as in JP-T 10-512104, touch panels as in JP-A 5-127822, 2002-48913, electronic papers as in JP-A 2000-98326, and solar cells as in Japanese Patent Application No. 7-160334.

<Optical Member>

An example of the optical member that comprises the barrier laminate of the invention is a circular polarizer.

(Circular Polarizer)

Laminating a barrier film substrate of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the invention are described more concretely with reference to the following Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below.

Unless otherwise specifically indicated, the organic layer and the inorganic layer were formed in a clean room at a class of 1000.

1. Formation of Organic Layer through Polymerization Under Normal Pressure, and Fabrications of Barrier Film Substrate A polyethylene naphthalate film (PEN film, Teijin DuPont's trade name, Teonex Q65FA) was cut into 20 cm square pieces, and a barrier laminate was formed on the side of the smooth surface thereof, and the thus-constructed samples were evaluated.

(1-1) Formation of First Layer (Organic Layer):

On the PEN film, a mixture solution of a monomer mixture having a composition shown in Table 1 (20 g), a UV polymerization initiator (Lamberti' trade name, ESACURE KTO-46) (0.6 g) and 2-butanone (190 g) was applied, using a wire bar, so as to form a liquid layer having a thickness of 5 μm. This was dried, then put into a chamber having an oxygen concentration of 0.1% after nitrogen substitution, and the organic layer was cured therein through irradiation with UV light from a high-pressure mercury lamp (integrated radiation, about 2 J/cm$^2$), thereby forming an organic layer having a thickness of 1000 nm±50 nm. The characteristic values of the obtained organic layer (conversion in polymerization, pencil hardness, microhardness, smoothness (Ra)) were measured according to the methods mentioned below, and the data are shown in Table 1. Each organic layer of Samples 1-10 was formed in a cleanroom of Class 1000 and the organic layer of Sample 11 was formed in an ordinary laboratory of Class 30000.

<Measurement of Conversion in Polymerization>

Both the cured film and the monomer mixture were analyzed for the absorption intensity based on the carbonyl group at around 1720 cm$^{-1}$ and the absorption intensity based on the carbon-carbon double bond at around 810 cm$^{-1}$, in IR spectrometry; and according to the following calculation formula, the monomer conversion in polymerization was computed.

$$\text{Conversion in Polymerization (\%)} = [(a \times d - b \times c)/a \times d] \times 100$$

wherein a indicates the peak intensity of the cured film at around 1720 cm$^{-1}$, b indicates the peak intensity of the cured film at around 810 cm$^{-1}$, c indicates the peak intensity of the monomer mixture at around 1720 cm$^{-1}$, d indicates the peak intensity of the monomer mixture at around 810 cm$^{-1}$.

<Measurement of Pencil Hardness>

Using a pencil scratch tester (by Toyo Seiki), the pencil hardness (film hardness) of the organic layer was measured according to JISK5400.

<Measurement of Microhardness>

Using Fisher's Picodenter HM500 Model, the microhardness was measured under a condition of a push depth of 50 nm.

<Measurement of Smoothness>

Using an atomic force microscope (AFM), the surface smoothness was measured. In this case, the smoothness was expressed as a mean roughness Ra (unit, m) within a sample area of 10 μm square.

As obvious from the results in Table 1, the sample 1 derived from the monomer with m=2 alone had a high conversion in polymerization but had a low pencil hardness of 2 B. The samples 2 to 5 derived from a monomer mixture containing a monomer with m=3 had a higher pencil hardness as compared with the sample 1. The samples 6 to 10 of the invention containing a monomer with m=4 or more in an amount of from 10 to 40% by mass had a high film hardness of H to 3H. Of those, the sample 8 derived from a monomer mixture of monomers with m=2, m=3 and m=4 and having a conversion in polymerization of not lower than 90% had the highest hardness.

(1-2) Formation of Second Layer (Inorganic Layer):

Using a sputtering device, an inorganic layer (aluminium oxide) was formed on the above organic layer. Aluminium was used as the target; argon was used as the discharge gas; and oxygen was used as the reaction gas. The film formation pressure was 0.1 Pa; and the ultimate film thickness was 60 nm. In that manner, barrier film substrate samples 1 to 10 having an inorganic layer laminated on an organic layer were constructed. The characteristic values (Ra, water vapor permeability) of the obtained barrier film substrates are shown in Table 1. Ra was measured in the same manner as in the above (1-1); and the water vapor permeability was measured according to the following two methods.

<Determination of Water Vapor Permeability according to MOCON Method>

Using a water vapor permeability tester (MOCON's PERMATRAN-W3/31), the samples 1 to 10 were analyzed for the water vapor permeability at 40° C. and a relative humidity of 90%. The detection limit of the tester is 0.005 g/m²/day.

<Determination of Water Vapor Permeability according to Ca Method>

According to the method described by G. NISATO, P. C. P. BOUTEN, P. J. SLIKKERVEER, et all, in SID Conference Record of the International Display Research Conference, pp. 1435-8 (measurement method with calcium), the samples 1 to 10 were analyzed for the water vapor permeability at 40° C. and a relative humidity of 90%.

<Count of Defects>

A hundred of areas of 1 mm square were chosen at random from each barrier film substrate sample with a scanning electron microscope (HITACHI S-4100, magnification of ×500) at an acceleration voltage of 5 kV. The number of defects in each area was counted and an average number was obtained. Defects having a longest length of at least 1 μm were only detected to count the number. The obtained average number was converted into the number of defects per 1 cm³.

As is obvious from the results in Table 1, the sample 1 in which the hardness of the organic layer is lower than a level of pencil hardness B has a rough surface represented by Ra and has a high water vapor permeability when laminated with an inorganic layer. On the other hand, the samples 2 to 10 in which the hardness of the organic layer is on the same level as or higher than a level of pencil hardness B have a water vapor permeability of at most 0.005 g/m²/day, therefore having good barrier property. Above all, the samples 3 to 10 in which the hardness of the organic layer is on the same level as or higher than a level of pencil hardness F have a surface roughness Ra of at most 2 nm when laminated with an inorganic layer, and as a result, they have a further lowered water vapor permeability of not higher than 0.001 g/m²/day. In particular, the samples 4 to 10 in which the hardness of the organic layer is on the same level as or higher than a level of pencil hardness of H have an extremely lowered water vapor permeability of less than 0.001 g/m²/day.

The above suggests that the barrier film substrate of the invention is favorable as a substrate of devices such as organic EL devices.

Of the samples 4 to 10, the samples 4 to 6 in which the hardness of the organic layer is on a level of pencil hardness H have, when laminated with an inorganic layer, a surface roughness Ra of less than 2 nm, a microhardness of from 150 to 155 N/mm and a water vapor permeability of from 0.0008 to 0.0009 g/m²·day. On the other hand, the samples 7 to 10 in which the hardness of the organic layer is on a level of pencil hardness 2H or higher than it have, when laminated with an inorganic layer, a surface roughness Ra of at most 1 nm and a microhardness of at least 160 N/mm, and therefore have a water vapor permeability of at most 0.0007 g/m²·day. From the above, it is known that the hard organic layer having a pencil hardness of at least 2H, the surface smoothness of the barrier film substrate having Ra of at most 1 nm, or the high microhardness of at least 160 N/mm are more desirable.

TABLE 1

| | Organic Layer | | | | | | | |
|---|---|---|---|---|---|---|---|---|
| | Amount of Monomer Added (mas. %) | | | | Polymerization/Film Formation | | Evaluation | |
| Sample No. | BEPGA (m = 2) | TMPTA (m = 3) | PETA (m = 4) | Ratio of (m = 2, 3):(m = 4) | Method | Conversion in Polymerization (%) | Microhardness (N/mm) | Pencil Hardness | Ra (nm) |
| 1 (Comparative Example) | 100 | 0 | 0 | 100:0 | Coating/Polymerization under ordinary pressure | 94 | 120 | 2B | 0.5 |
| 2 (the Invention) | 90 | 10 | 0 | 100:0 | Coating/Polymerization under ordinary pressure | 93 | 140 | B | 0.5 |
| 3 (the Invention) | 80 | 20 | 0 | 100:0 | Coating/Polymerization under ordinary pressure | 92 | 145 | F | 0.5 |
| 4 (the Invention) | 70 | 30 | 0 | 100:0 | Coating/Polymerization under ordinary pressure | 91 | 150 | H | 0.5 |
| 5 (the Invention) | 60 | 40 | 0 | 100:0 | Coating/Polymerization under ordinary pressure | 90 | 155 | H | 0.5 |
| 6 (the Invention) | 90 | 0 | 10 | 90:10 | Coating/Polymerization under ordinary pressure | 91 | 150 | H | 0.4 |
| 7 (the Invention) | 80 | 0 | 20 | 80:20 | Coating/Polymerization under ordinary pressure | 91 | 160 | 2H | 0.4 |
| 8 (the Invention) | 60 | 20 | 20 | 80:20 | Coating/Polymerization under ordinary pressure | 90 | 180 | 3H | 0.4 |
| 9 (the Invention) | 70 | 0 | 30 | 70:30 | Coating/Polymerization under ordinary pressure | 89 | 175 | 2H | 0.4 |
| 10 (the Invention) | 60 | 0 | 40 | 60:40 | Coating/Polymerization under ordinary pressure | 88 | 175 | 2H | 0.4 |
| 11 (the Invention) | 60 | 0 | 40 | 60:40 | Coating/Polymerization under ordinary pressure | 88 | 175 | 2H | 0.4 |

TABLE 1-continued

| Sample No. | Inorganic Layer Film Thickness (nm) | Ra (nm) | Water Vapor Permeability (g/m²/day) MOCON Method | Ca Method | Number of Defects |
|---|---|---|---|---|---|
| 1 (Comparative Example) | 60 | 2.5 | 0.01 | — | 30 |
| 2 (the Invention) | 60 | 2.2 | 0.005 | — | 10 |
| 3 (the Invention) | 60 | 1.8 | <0.005 | 0.001 | 25 |
| 4 (the Invention) | 60 | 1.7 | <0.005 | 0.0009 | 30 |
| 5 (the Invention) | 60 | 1.7 | <0.005 | 0.0008 | 10 |
| 6 (the Invention) | 60 | 1.6 | <0.005 | 0.0009 | 25 |
| 7 (the Invention) | 60 | 0.9 | <0.005 | 0.0007 | 20 |
| 8 (the Invention) | 60 | 0.8 | <0.005 | 0.0006 | 30 |
| 9 (the Invention) | 60 | 0.9 | <0.005 | 0.0007 | 5 |
| 10 (the Invention) | 60 | 0.9 | <0.005 | 0.0007 | 25 |
| 11 (the Invention) | 60 | 0.9 | <0.005 | 0.002 | 120 |

2. Fabrication of Barrier Film Substrate in Different Film Formation Methods for Organic Layer (2-1) Formation of First Layer (Organic Layer):

An organic layer of a sample 11 was formed according to the following process.

A polyethylene naphthalate film (PEN film, Teijin-DuPont's trade name, Teonex Q65FA) was cut into 20 cm square pieces. Using an organic/inorganic laminate film formation device (Vitex Systems' Guardian 200), an organic layer was formed on the side of the smooth surface of the film. This device is for forming an organic layer and an inorganic layer continuously all in vacuum, and therefore, the barrier layer to be produced therein is not exposed to open air until the completion of its production. The organic layer formation method in the device is flash vapor evaporation at an inner pressure of 3 Pa, and the UV radiation energy for polymerization is 2 J/cm². As the material for the organic layer, used was a mixture solution of BEPGA (60 g), TMPTA (20 g), PETA (20 g), and a UV polymerization initiator (ESACURE-TZT, 5 g).

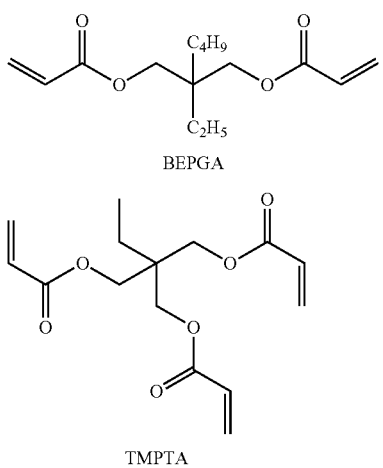

BEPGA

TMPTA

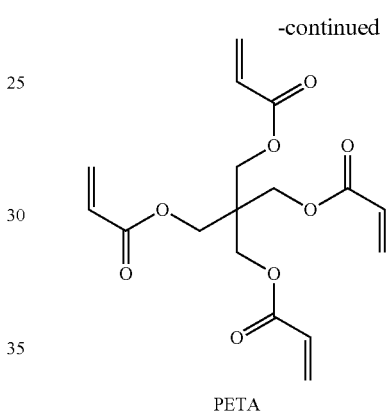

PETA

As a comparison for clarifying the effect of the flash vapor deposition, an organic layer of a sample 12 was formed in the same manner as in the above sample 8, for which, however, the UV curing was attained under a reduced inner pressure of 3 Pa.

As a comparison for clarifying the effect of the reduced pressure curing, an organic layer of a sample 13 was formed in the same manner as in the above sample 8.

The thickness of the organic layer in all the samples 11 to 13 was 1000 nm. The characteristic values (conversion in polymerization, microhardness, pencil hardness, Ra) of the organic layer are shown in Table 2.

As is obvious from the comparison in Table 2, the conversion in polymerization is higher in an order of organic layer formed by flash vapor deposition>organic layer formed by ordinary pressure coating and reduced pressure curing>organic layer formed by ordinary pressure coating and ordinary pressure curing; and the film hardness is higher in that order.

(2-2) Formation of Second Layer (Inorganic Layer):

Next, using Guardian 200 used in (2-1), gas-barrier film substrates of samples 11 to 13 were fabricated. The sample 11 was fabricated all the time in vacuum, in which the organic layer and the inorganic layer were continuously formed in the same vacuum chamber. For inorganic film formation, employed was aluminium oxide film formation according to a DC-pulse reactive sputtering method with aluminium as a target (in which the reaction gas is oxygen). The thickness of the formed inorganic layer was 60 nm. The characteristic values (Ra, water vapor permeability measured according to ca method) of the obtained barrier film substrates are shown in Table 2.

As is obvious from the results in Table 2, it is known that the water vapor permeability lowers (that is, the barrier property is enhanced) in correspondence to the hardness of the organic layer. From the above, it is known that using flash vapor deposition in organic layer formation gives a more excellent barrier film substrate. It is also known that even the coating method of layer formation is effective for enhancing the barrier property when the coating layer is cured under reduced pressure.

3. Fabrication of Barrier Film Substrate, using Monomer Having Oxygen-Containing Functional Group in the Linking Group A sample 14 was fabricated in the same manner as above, for which, however, in the above (1-1) formation of first layer (organic layer) and (1-2) formation of second layer (inorganic layer), the trifunctional monomer TMPTA was changed to TMPA-3EO. As in Table 3, the sample 14, for which was used TMPA-3EO having an oxygen-containing functional group in the linking group, was comparable to the sample 4 in point of the conversion in polymerization of 91%, but was inferior to the sample 4, for which TMPTA was used, in point of the film hardness and the water vapor permeability.

A sample 15 was fabricated in the same manner as above, for which, however, in the above (1-1) formation of first layer (organic layer) and (1-2) formation of second layer (inorganic layer), the bifunctional monomer BEPGA was changed to TPGDA (tripropylene glycol diacrylate). As in Table 3, the sample 15, for which was used TPGDA having an oxygen-containing functional group in the linking group, was comparable to the sample 4 in point of the conversion in polymerization of 91%, but was inferior to the sample 4, for which BEPGA was used, in point of the film hardness and the water vapor permeability.

TABLE 2

| | Organic Layer | | | | | Polymerization/Film Formation | | | | | Inorganic Layer | Evaluation of Barrier Film Substrate | |
|---|---|---|---|---|---|---|---|---|---|---|---|---|---|
| | Amount of Monomer Added (mas. %) | | | | | | Conversion in Polymerization (%) | Evaluation | | | Film Thickness (nm) | | |
| Sample No. | BEPGA (m = 2) | TMPTA (m = 3) | PETA (m = 4) | Ratio of (m = 2, 3):(m = 4) | Method | | | Micro-hardness (N/mm) | Pencil Hardness | Ra (nm) | | Ra (nm) | Water Vapor Permeability (g/m²/day) |
| 11 (the Invention) | 60 | 20 | 20 | 80:20 | Flash Vapor Deposition/ Polymerization under reduced pressure | | 93 | 200 | 4H | 0.4 | 60 | 0.7 | 0.0004 |
| 12 (the Invention) | 60 | 20 | 20 | 80:20 | Coating under ordinary pressure/ Polymerization under reduced pressure | | 92 | 195 | 4H | 0.4 | 60 | 0.7 | 0.0005 |
| 13 (the Invention) | 60 | 20 | 20 | 80:20 | Coating/ Polymerization under ordinary pressur | | 90 | 180 | 3H | 0.4 | 60 | 0.8 | 0.0006 |

TABLE 3

| | Organic Layer | | | | | | Polymerization/Film Formation | | | | | Inorganic Layer | Evaluation of Barrier Film Substrate | |
|---|---|---|---|---|---|---|---|---|---|---|---|---|---|---|
| | Amount of Monomer Added (mas. %) | | | | | | | Conversion in Polymerization (%) | Evaluation | | | Film Thickness (nm) | | |
| Sample No. | BEPGA (m = 2) | TPGDA (m = 2) | TMPTA (m = 3) | TMPA-3EO (m = 3) | Ratio of (m = 2, 3):(m = 4) | Method | | | Micro-hardness (N/mm) | Pencil Hardness | Ra (nm) | | Ra (nm) | Water Vapor Permeability (g/m²/day) |
| 4 (the Invention) | 70 | 0 | 30 | 0 | 100:0 | Coating/ Polymerization under ordinary pressure | | 91 | 150 | H | 0.5 | 60 | 1.7 | 0.0009 |

TABLE 3-continued

| | Organic Layer | | | | | | | | | | | |
|---|---|---|---|---|---|---|---|---|---|---|---|---|
| | Amount of Monomer Added (mas. %) | | | | Polymerization/Film Formation | | | Evaluation | | Inorganic Layer | | Evaluation of Barrier Film Substrate |
| Sample No. | BEPGA (m = 2) | TPGDA (m = 2) | TMPTA (m = 3) | TMPA-3EO (m = 3) | Ratio of (m = 2, 3):(m = 4) | Method | Conversion in Polymerization (%) | Microhardness (N/mm) | Pencil Hardness | Ra (nm) | Film Thickness (nm) | Ra (nm) | Water Vapor Permeability (g/m²/day) |
| 14 (the Invention) | 70 | 0 | 0 | 30 | 100:0 | Coating/Polymerization under ordinary pressure | 91 | 140 | F | 0.5 | 60 | 1.9 | 0.001 |
| 15 (the Invention) | 0 | 70 | 30 | 0 | 100:0 | Coating/Polymerization under ordinary pressure | 91 | 140 | F | 0.5 | 60 | 2.0 | 0.003 |

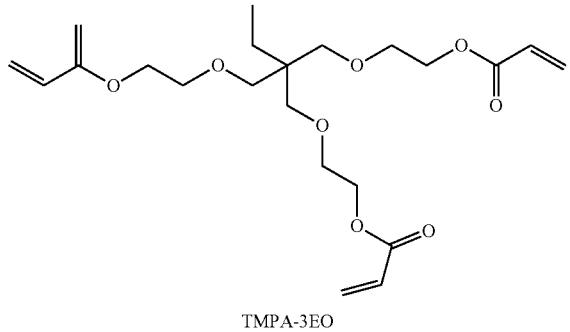

TMPA-3EO

4. Fabrication of Multilayer Laminate Barrier Film Substrate

Laminate barrier film substrate, samples 21 to 26 having a layer constitution shown in Table 4 were fabricated according to the same method as that for the sample 11, for which, however, the layers were laminated in a desired manner. The water vapor permeability of the barrier film substrates was measured, and shown in Table 4.

As is obvious from the results in Table 4, the barrier film substrates of the invention all had a water vapor permeability of less than 0.001 g/m²/day, and therefore have extremely good barrier property. For attaining the water vapor permeability of less than 0.001 g/m²/day, at least one organic layer and at least one inorganic layer are indispensable.

5. Construction and Evaluation of Organic EL Device (5-1) Construction of Organic EL Device:

An ITO film-coated conductive glass substrate (surface resistivity, 10 Ω/square) was washed with 2-propanol, and then subjected to UV-ozone treatment for 10 minutes. On this substrate (anode), the following organic compound layers were deposited in order according to a vapor deposition method.

| (First Hole Transportation Layer) | |
|---|---|
| Copper Phthalocyanine | thickness 10 nm |
| (Second Hole Transportation Layer) | |
| N,N'-diphenyl-N,N'-dinaphthylbenzidine | thickness 40 nm |
| (Light Emission Layer serving also as electron transportation layer) | |
| Tris(8-hydroxyquinolinato)aluminium | thickness 60 nm |

Finally, lithium fluoride was vapor-deposited in a thickness of 1 nm and metal aluminium was in a thickness of 100 nm in that order, serving as a cathode. On this, a silicon nitride film having a thickness of 5 μm was formed according to a parallel plate CVD method, thereby constructing an organic EL device.

(5-2) Disposition of Gas-Barrier Layer on Organic EL Device:

Using a thermosetting adhesive (Daizo-Nichimori's Epotec 310), the device was stuck to the barrier film substrate, sample 22 to 26, and heated at 65° C. for 3 hours to cure the adhesive. Thus sealed, 20 samples of every organic EL device were constructed.

(5-3) Evaluation of Organic EL Device for the Surface Condition with Light Emission:

Immediately after their construction, the organic EL devices were driven for light emission at a voltage of 7V applied thereto, using a source measure unit, Keithley's SMU2400 Model. Using a microscope, the surface of each sample was checked for its condition with light emission, and it was confirmed that all the devices gave uniform light emission with no dark spot.

Next, the devices were kept in a dark room at 60° C. and a relative humidity of 90% for 500 hours, and checked for the surface condition with light emission. The ratio of the samples having given darks spots larger than 300 μm in diameter are defined as a failure ratio, and the failure ratio of each device is shown in Table 4.

TABLE 4

| Sample No. | Barrier Film Substrate | | | | | | Water Vapor Permeability (g/m²/day) | Organic EL device Failed Ratio (%) |
|---|---|---|---|---|---|---|---|---|
| | Layer Constitution | | | | | | | |
| | 1st Layer | 2nd Layer | 3rd Layer | 4th Layer | 5th Layer | 6th Layer | | |
| 21 (Comparative Example) | Inorganic Layer | no | no | no | no | no | 0.15 | 15 |
| 22 (the Invention) | Organic Layer | Inorganic Layer | no | no | no | no | 0.0004 | <1 |
| 23 (the Invention) | Inorganic Layer | Organic Layer | Inorganic Layer | no | no | no | 0.0002 | <1 |
| 24 (the Invention) | Organic Layer | Inorganic Layer | Organic Layer | Inorganic Layer | no | no | <0.0001 | <1 |
| 25 (the Invention) | Inorganic Layer | Organic Layer | Inorganic Layer | Organic Layer | Inorganic Layer | no | <0.0001 | <1 |
| 26 (the Invention) | Organic Layer | Inorganic Layer | Organic Layer | Inorganic Layer | Organic Layer | Inorganic Layer | <0.0001 | <1 |

As is obvious from the results in Table 4, it is known that the organic EL devices sealed with the barrier film substrate of the invention, samples 22 to 26 have excellent wet heat durability. In addition, it is also known that the barrier film substrates of the invention having at least two organic layers and at least two inorganic layers lower the failed ratio when mounted on organic EL devices, and are therefore especially favorable.

6. Organic EL Device with Laminate of the Invention

Organic EL devices were constructed in the same manner as in the above (5-1) construction of organic EL device. Using Guardian 200, an organic/inorganic laminate was formed on the devices, in the same manner as that for the above (2-1) formation of first layer (organic layer) and (2-2) formation of the second layer (inorganic layer). However, for the organic layer, used as a mixture of BEPGA (60 g), TMPTA (20 g), PETA (20 g) and a UV polymerization initiator (ESACURE-TZT, 5 g), and the layer thickness was 1000 nm. The inorganic layer was aluminium oxide having a thickness of 60 nm.

The devices were evaluated in the same manner as in the above (5-3), and the failed ratio was at most 1%.

The laminate produced according to the production method of the invention have a low water vapor permeability even though it comprises only one pair of an organic layer and an inorganic layer. According to the production method of the invention, a barrier film substrate having the laminate produced according to the production method of the invention can be readily produced. Further, the device and the optical member of the invention have a low water vapor permeability and a low failed ratio, and therefore the industrial applicability and usefulness of the invention is high.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 039015/2007 filed on Feb. 20, 2007, Japanese Patent Application No. 280930/2007 filed on Oct. 29, 2007 and Japanese Patent Application No. 334265/2007 filed on Dec. 26, 2007, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier laminate comprising an organic layer and an inorganic layer laminated thereon, wherein the water vapor permeability per one inorganic layer that constitutes the gas barrier laminate, at 40° C. and a relative humidity of 90%, is at most $1 \times 10^{-3}$ g/m²·day, wherein the organic layer comprises, as the main ingredient thereof, a polymer having a structural unit of the following formula (2) wherein n is 2 and a structural unit of the following formula (2) wherein n is 3 or more:

$$(Z-COO)_n\text{-}L \qquad \text{Formula (2)}$$

wherein Z is represented by the following (a) or (b): $R^2$ and $R^3$ in the structures each independently represent a hydrogen atom or a methyl group: * indicates the position at which the structure bonds to the carbonyl group in formula (2): L represents an n-valent linking group: a number n of Z's may be the same or different, but at least one Z is represented by the following (a):

and, wherein the thickness of the inorganic layer is from 20 to 60 nm.

2. The gas barrier laminate according to claim 1, wherein a number of defects with a length of at least 1 μm on a surface of the barrier laminate is at most 30.

3. The gas barrier laminate according to claim 1, wherein the organic layer has a pencil hardness of at least 2H.

4. The as barrier laminate according to claim 1, wherein the organic layer has a microhardness of at least 150 N/mm.

5. The gas barrier laminate according to claim 1, wherein a smoothness of the inorganic layer is on a level of at most 1 nm in terms of a mean roughness in a 10 μm square.

6. A gas barrier film substrate having the gas barrier laminate of claim 1 on a surface of a plastic film.

7. A gas barrier film substrate having, on at least one surface of a plastic film, a barrier layer that has a structure of an organic layer and an inorganic layer laminated thereon, wherein the organic layer comprises, as the main ingredient thereof, a polymer having a structural unit of the following formula (2) wherein n is 2 and a structural unit of the following formula (2) wherein n is 3 or more:

$$(Z-COO)_n-L \qquad \text{Formula (2)}$$

wherein Z is represented by the following (a) or (b); $R^2$ and $R^3$ in the structures each independently represent a hydrogen atom or a methyl group; * indicates the position at which the structure bonds to the carbonyl group in formula (2); L represents an n-valent linking group; a number n of Z's may be the same or different, but at least one Z is represented by the following (a):

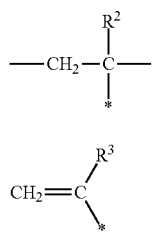

and wherein the thickness of the inorganic layer is from 20 to 60 nm.

8. The gas barrier film substrate according to claim 7, wherein the polymer contains the structural unit of formula (2) wherein n is 2 and the structural unit of formula (2) wherein is 3 in an amount of at least 75% by mass in total.

9. The gas barrier film substrate according to claim 7, wherein the organic layer comprises, as the main ingredient thereof, a polymer having a structural unit of the formula (2) wherein n is 2 and a structural unit of the formula (2) wherein n is 3.

10. The gas barrier film substrate according to claim 9, wherein the polymer contains the structural unit of formula (2) wherein n is 2 in an amount of from 60 to 80% by mass, and the structural unit of formula (2) wherein n is 3 in an amount of from 20 to 40% by mass.

11. The gas barrier film substrate according to claim 7, wherein the organic layer comprises, as the main ingredient thereof, a polymer having a structural unit of the formula (2) wherein n is 2 and a structural unit of the formula (2) wherein n is 4 or more.

12. The gas barrier film substrate according to claim 11, wherein the polymer contains the structural unit of formula (2) wherein n is 2 in an amount of from 60 to 80% by mass, and the structural unit of formula (2) wherein n is 4 or more in an amount of from 20 to 40% by mass.

13. The gas barrier film substrate according to claim 7, wherein the organic layer comprises, as the main ingredient thereof, a polymer having a structural unit of the formula (2) wherein n is 2, a structural unit of the formula (2) wherein n is 3 and a structural unit of the formula (2) wherein n is 4 or more.

14. The gas barrier film substrate according to claim 13, wherein the polymer contains the structural unit of formula (2) wherein n is 2 and/or the structural unit of formula (2) wherein n is 3 in an amount of from 75 to 95% by mass in total, and the structural unit of formula (2) wherein n is 4 or more in an amount of from 5 to 25% by mass.

15. The gas barrier film substrate according to claim 7, wherein L in formula (2) is a linking group not containing an oxygen-containing functional group.

* * * * *